United States Patent
Cha et al.

(10) Patent No.: US 7,580,486 B2
(45) Date of Patent: Aug. 25, 2009

(54) MULTI-INPUT MULTI-FREQUENCY SYNTHESIZING APPARATUS AND METHOD FOR MULTI-BAND RF RECEIVER

(75) Inventors: Choong-Yul Cha, Yongin-si (KR); Eun Chul Park, Yongin-si (KR); Hoon Tae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 646 days.

(21) Appl. No.: 11/439,222

(22) Filed: May 24, 2006

(65) Prior Publication Data

US 2007/0140392 A1     Jun. 21, 2007

(30) Foreign Application Priority Data

Dec. 16, 2005   (KR) .................. 10-2005-0124589

(51) Int. Cl.
*H04L 27/06* (2006.01)
*H04L 27/04* (2006.01)
*H04L 23/00* (2006.01)

(52) U.S. Cl. .................. 375/344; 375/301; 375/377

(58) Field of Classification Search ............... 375/316, 375/326, 344, 268, 272, 277, 300, 301, 377; 455/323, 324, 130, 161.1, 165.1, 164.1; 327/39, 327/44–46; 329/347, 356, 357
See application file for complete search history.

(56) References Cited

U.S. PATENT DOCUMENTS 7,392,026 B2 *   6/2008  Alam et al. ............... 455/180.1

| | | | |
|---|---|---|---|
| 2004/0253938 A1 | 12/2004 | Vaara | |
| 2005/0197088 A1 | 9/2005 | Schmidt | |
| 2007/0104290 A1* | 5/2007 | Cha et al. | 375/321 |
| 2007/0178869 A1* | 8/2007 | Park et al. | 455/260 |
| 2009/0061811 A1* | 3/2009 | Park et al. | 455/323 |

FOREIGN PATENT DOCUMENTS

| JP | 10-056392 A | 2/1998 |
|---|---|---|
| JP | 2003-008355 A | 1/2003 |
| JP | 2004-320293 A | 11/2004 |
| JP | 2005-065095 A | 3/2005 |
| KR | 10-2000-0038360 A | 7/2000 |
| KR | 10-2000-0047695 A | 7/2000 |
| KR | 10-2004-0055085 A | 6/2004 |

OTHER PUBLICATIONS

Jung et al., "A Frequency Sensitive for UWB Transceiver in 0.13μm CMOS Technology," IEEE, Apr. 23, 2009, pp. 294-297.*
Nuntachai et al, "A1.5 V.07-2.5 GHz CMOS Quad Demodulator for Multi-Band Direct Conversion receiver," IEEE, Apr. 23, 2009, pp. 27.2.2-27.2.4.*

\* cited by examiner

*Primary Examiner*—Tesfaldet Bocure
(74) *Attorney, Agent, or Firm*—Sughrue Mion, PLLC (57) ABSTRACT

A multi-input multi-frequency synthesizing apparatus and method for a multi-band radio frequency (RF) receiver. The frequency synthesizing apparatus may generate an output from a greater number of high frequency signals by using one multi-input single side band (SSB) mixer. The multi-input SSB mixer may generate a signal whose frequency is an addition of frequencies of two signals selected from a signal selection control unit, or a difference of frequencies therebetween. According to a circuit configuration of the multi-input SSB mixer, the signal selection control unit may select more than two signals.

16 Claims, 7 Drawing Sheets

MULTI-INPUT MULTI-FREQUENCY SYNTHESIZING APPARATUS AND METHOD FOR MULTI-BAND RF RECEIVER

CROSS-REFERENCE TO RELATED APPLICATION

This application claims priority from Korean Patent Application No. 10-2005-0124589, filed on Dec. 16, 2005, in the Korean Intellectual Property Office, the entire disclosure of which is incorporated herein by reference.

BACKGROUND OF THE INVENTION

1. Field of the Invention

The present invention relates to a frequency synthesizing apparatus for a multi-band radio frequency (RF) receiver, and more particularly, to a multi-input multi-frequency synthesizing apparatus and method which can reduce a circuit area and may be low powered.

2. Description of Related Art

A high speed wireless data transceiving system such as a cellular phone, a digital multimedia broadcasting (DMB) phone, a personal digital assistant (PDA), etc., needs a frequency synthesizer or a frequency mixer processing multi-tones for frequency down conversion in a transceiver. As an example, a multi-frequency synthesizer is utilized to receive a radio frequency (RF) signal and convert the received RF signal into a baseband signal, in a Code Division Multiple Access (CDMA) system, a global positioning system (GPS), a personal communication system (PCS), an International Mobile Telecommunication (IMT)-2000 system, Wireless Broadband Internet (WiBro) system, a wireless local area network (WLAN) system, an Ultra Wideband (UWB) system, and WiMax system for a ubiquitous system.

Figure 1:
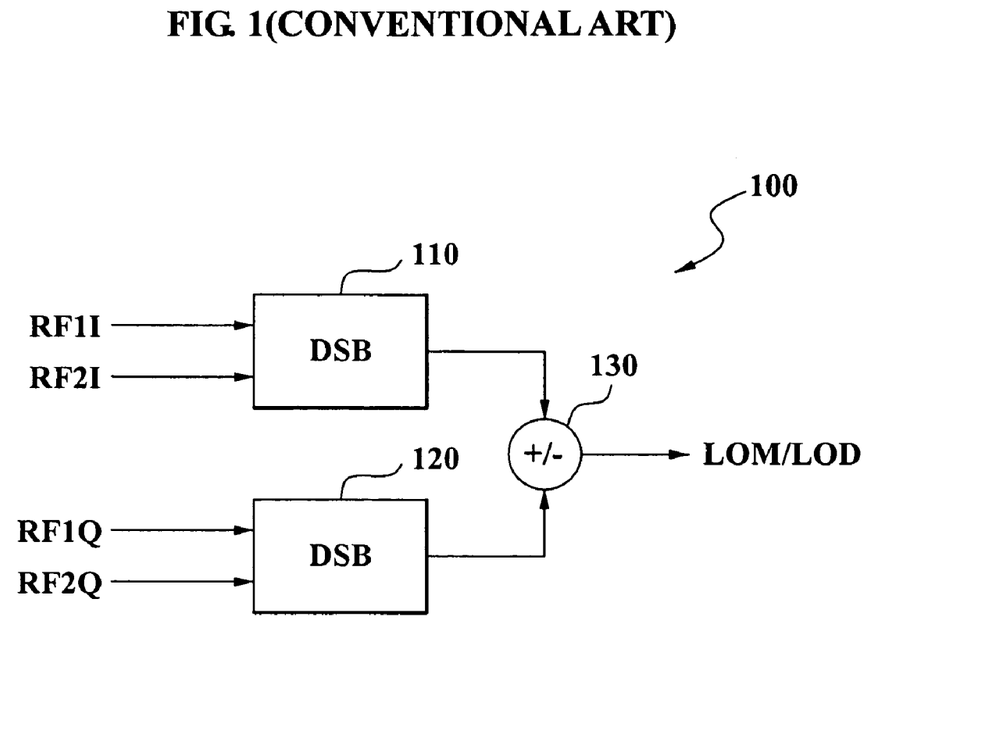
FIG. 1 is a diagram illustrating an SSB mixer according to a conventional art.

FIG. 1 is a diagram illustrating a single side band (SSB) mixer 100 according to the conventional art. Referring to FIG. 1, the SSB mixer 100 includes a first double side band (DSB) mixer 110, a second DSB mixer 120 and an adder/subtractor 130.

Each of the first DSB mixer 110 and the second DSB mixer outputs a DSB signal simultaneously mixed with a component which is an addition of frequencies of two received signals and another component which is a difference of frequencies therebetween. Namely, the first DSB mixer 110 outputs a DSB signal mixed with both a component which is an addition of frequencies of a first high frequency signal RF1I and a second high frequency signal RF2I and a component which is a difference of frequencies therebetween. The second DSB mixer 120 outputs a DSB signal mixed with both a component, which is an addition of frequencies of a Q signal, RF1Q, of the first high frequency signal RF1I and a Q signal, RF2Q, of the second high frequency signal RF2I, and a component which is a difference of frequencies of the two Q signals. In this instance, a Q signal is a quadrature signal having a 90 degree phase difference. Accordingly, when outputs of the first DSB mixer 110 and the second DSB mixer 120 pass through the adder/subtractor 130, an SSB signal LOM or an SSB signal LOD may be outputted. In this instance, the SSB signal LOM is a signal whose frequency is an addition of frequencies of the first high frequency signal RF1I and the second frequency signal RF2I, and the SSB signal LOD is a signal whose frequency is a difference of frequencies therebetween.

As described above, a single SSB mixer can only generate two components which are an addition of frequencies of two received signals or a difference of frequencies therebetween. Accordingly, a plurality of SSB mixers and switches are generally utilized for processing a multi-band in a ubiquitous system.

Figure 2:
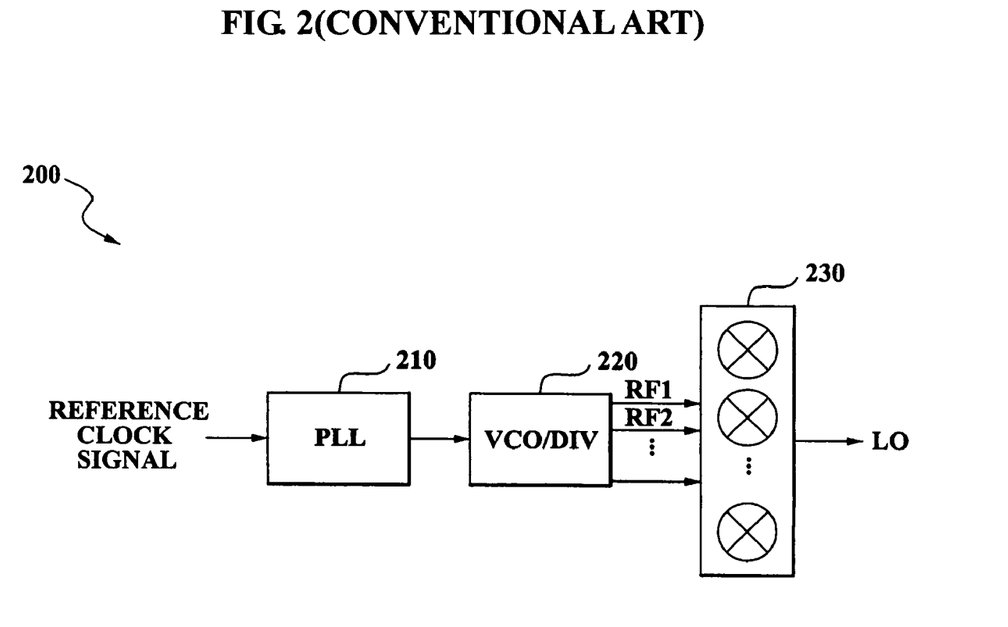
FIG. 2 is a diagram illustrating a frequency synthesizer for generating a multi-frequency signal according to a conventional art.

FIG. 2 is a diagram illustrating a frequency synthesizer 200 for generating multi-tones according to the conventional art. Referring to FIG. 2, a plurality of SSB mixers 230 are utilized for supplying a corresponding local signal LO to a receiver (Rx) mixer. In this instance, the Rx mixer down converts a multi-band RF signal received from an RF receiver to a baseband. The plurality of SSB mixers 230 receive high frequency signals, RF1, RF2, . . . , from a voltage controlled oscillator (VCO)/frequency divider (DIV) 220, which are connected to a phase locked loop (PLL) 210, and synthesize a necessary frequency signal. In this instance, a plurality of PLLs, VCOs or DIVs may be utilized. Also, switches are needed for selecting any one of multi-frequency signals synthesized in the SSB mixers 230, which is necessary for down-converting a received RF signal. As an example, when high frequency signals in an n number of bands are generated by using the VCO/DIV 220, $2^n$ of frequency signals may be generated by using $2^{n-1}$ of SSB mixers 230.

As described above, necessary multi-band signals may be generated by using a large number of SSB mixers. However, in this case, a required circuit area may be unacceptably increased to accommodate a PLL, a VCO/DIV and SSB mixers, and a large amount of power may also be consumed.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention is to provide a multi-input multi-frequency synthesizer which can be very efficient in utilizing a circuit area and a power consumption so as to be applicable to a multi-band RF receiver.

Another aspect of the present invention is to provide a multi-input multi-frequency synthesizing method in which one frequency synthesizer can receive multi-inputs and synthesize multi-frequency signals.

According to an aspect of the present invention, there is provided a frequency synthesizer including: a first multi-input double side band (DSB) mixer synthesizing a first input signal and a second input signal, which are selected from a plurality of high frequency signals, and generating a first synthesized signal; and a second multi-input DSB mixer synthesizing a Q signal of the first input signal and a Q signal of the second input signal, and generating a second synthesized signal; and a single side band (SSB) signal selection unit synthesizing a frequency of the first input signal and a frequency of the second input signal from the first synthesized signal and the second synthesized signal, and generating a third synthesized signal.

According to another aspect of the present invention, there is provided a frequency synthesizer including: a signal selection control unit selecting and outputting a first signal and a Q signal of the first signal and a second signal and a Q signal of the second signal, from a plurality of high frequency signals; and a multi-input single side band (SSB) mixer generating and outputting a signal, whose frequency is a synthesis of frequencies of the first signal and the second signal, from the first signal and the Q signal of the first signal and the second signal and the Q signal of the second signal, selected by the signal selection control unit, wherein DSB mixers included in the multi-input SSB mixer include transistors for receiving the plurality of high frequency signals, and the multi-input SSB mixer generates and outputs a corresponding frequency synthesized signal when signals selected by the signal selection control unit are changed.

In this instance, the frequency synthesizer may utilize at least one voltage controlled oscillator (VCO) generating a portion of the plurality of high frequency signals and a portion of the Q signals of the plurality of high frequency signals; and at least one frequency divider generating a remaining portion of the plurality of high frequency signals and a remaining portion of the Q signals of the plurality of high frequency signals, based on a signal generated from the at least one VCO. Also, the frequency synthesizer may utilize an output signal selection unit selecting and outputting any one of the plurality of high frequency signals and the output of the multi-input SSB mixer.

As described above, since an output of the frequency synthesizer are synthesized with a radio frequency (RF) signal received from an RF receiver in a predetermined mixer, the output of the frequency synthesizer may be utilized to directly down-convert the received RF signal to a baseband signal.

According to still another aspect of the present invention, there is provided a method of synthesizing frequencies, the method including: first synthesizing a first input signal and a second input signal selected from a plurality of high frequency signals, in a first DSB mixer including transistors for receiving the plurality of high frequency signals; second synthesizing a Q signal of the first input signal and a Q signal of the second input signal selected from Q signals of the plurality of high frequency signals, in a second DSB mixer including transistors for receiving the Q signals of the high frequency signals; and third synthesizing the first synthesized signal and the second synthesized signal.

Additional and/or other aspects of the present invention will be set forth in part in the description which follows and, in part, will be obvious from the description, or may be learned by practice of the invention.

BRIEF DESCRIPTION OF THE DRAWINGS

The above and other aspects of the present invention will become apparent and more readily appreciated by describing certain exemplary embodiments of the present invention with reference to the accompanying drawings, in which.

DETAILED DESCRIPTION OF EMBODIMENTS

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 3:
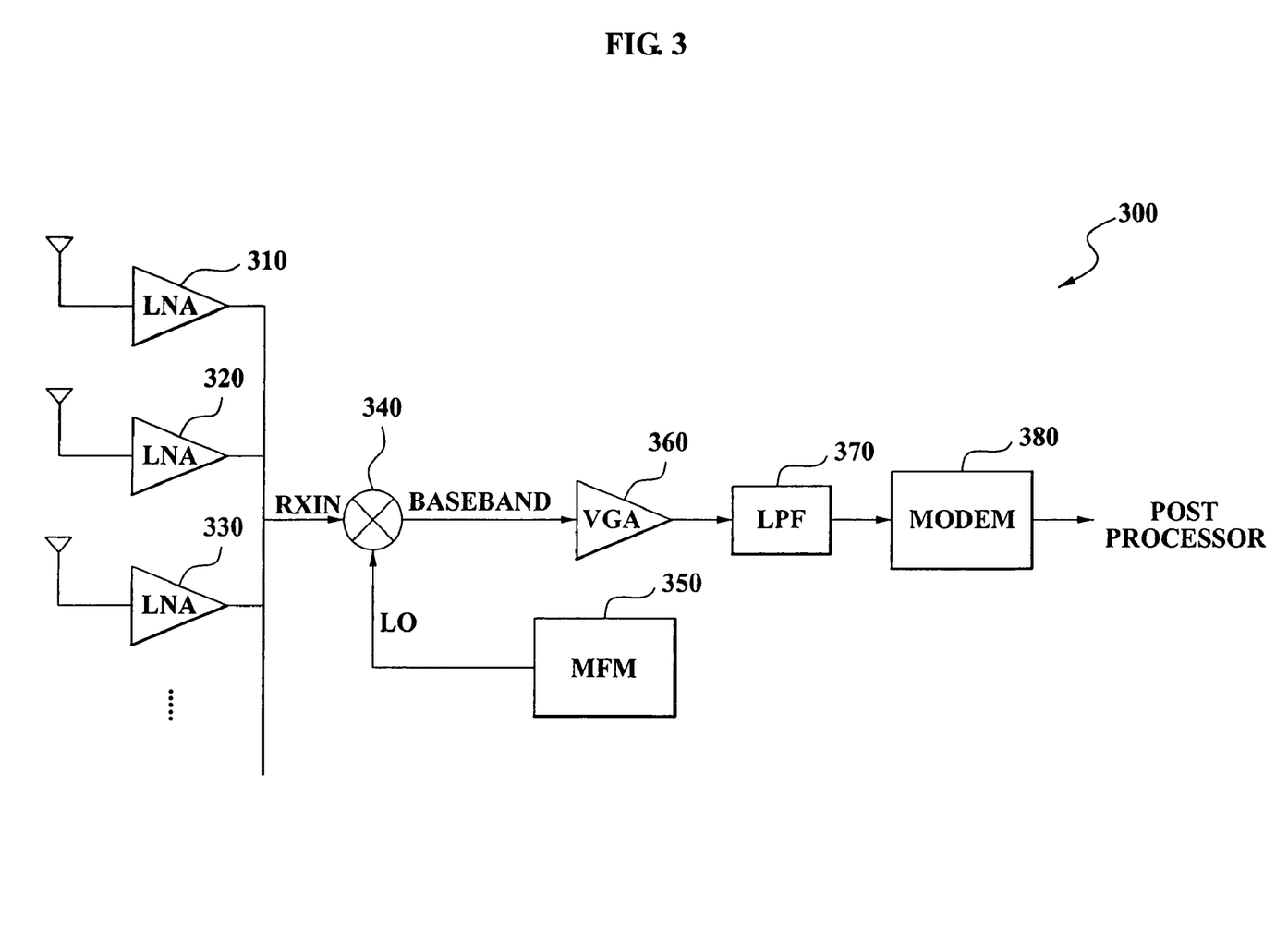
FIG. 3 is a diagram illustrating a multi-band RF receiver according to an exemplary embodiment of the present invention.

FIG. 3 is a diagram illustrating a multi-band RF receiver 300 according to an exemplary embodiment of the present invention. Referring to FIG. 3, the multi-band RF receiver 300 includes a multi-input multi-frequency mixer (MFM) 350. The MFM 350 generates multi-local signals LO for a receiver mixer (Rx mixer) 340.

The RF receiver 300 may receive satellite signals or terrestrial signals so as to embody a ubiquitous system which can include any type of standards such as a Code Division Multiple Access (CDMA), a global positioning system (GPS), a global system for mobile communications (GSM), a personal communication system (PCS), an International Mobile Telecommunication (IMT)-2000 system, wireless broadband Internet (WiBro) system, a wireless local area network (WLAN) system, an ultra wideband (UWB) system, and WiMax system. Each signal received via antennas may be amplified in a corresponding low noise amplifier (LNA) of LNAs 310 to 330, and inputted into the Rx mixer 340.

The Rx mixer 340 synthesizes any one of received RF signals RXIN via the LNAs 310 to 330 and any one of local signals LO generated in the MFM 350, and directly down converts the received RF signal to a baseband signal. As an example, when any one of outputs RXIN of the LNAs 310 to 330 is selected, the MFM 350 generates a corresponding local signal to convert the selected RF signal to a baseband signal. The Rx mixer 340 generates a baseband signal in which the selected RF signal and the output of the MFM 350 are synthesized.

The baseband signal outputted from the Rx mixer 340 may be appropriately amplified in a variable gain amplifier (VGA) 360 for easy post process. In this instance, the amplified signal is processed in a low pass filter (LPF) 370. A low frequency signal, which is low pass filtered in the LPF 370, may be demodulated in a MODEM 380. The demodulated signal may be further processed in a post processor and outputted as an image or audio that a user can recognize.

Figure 4:
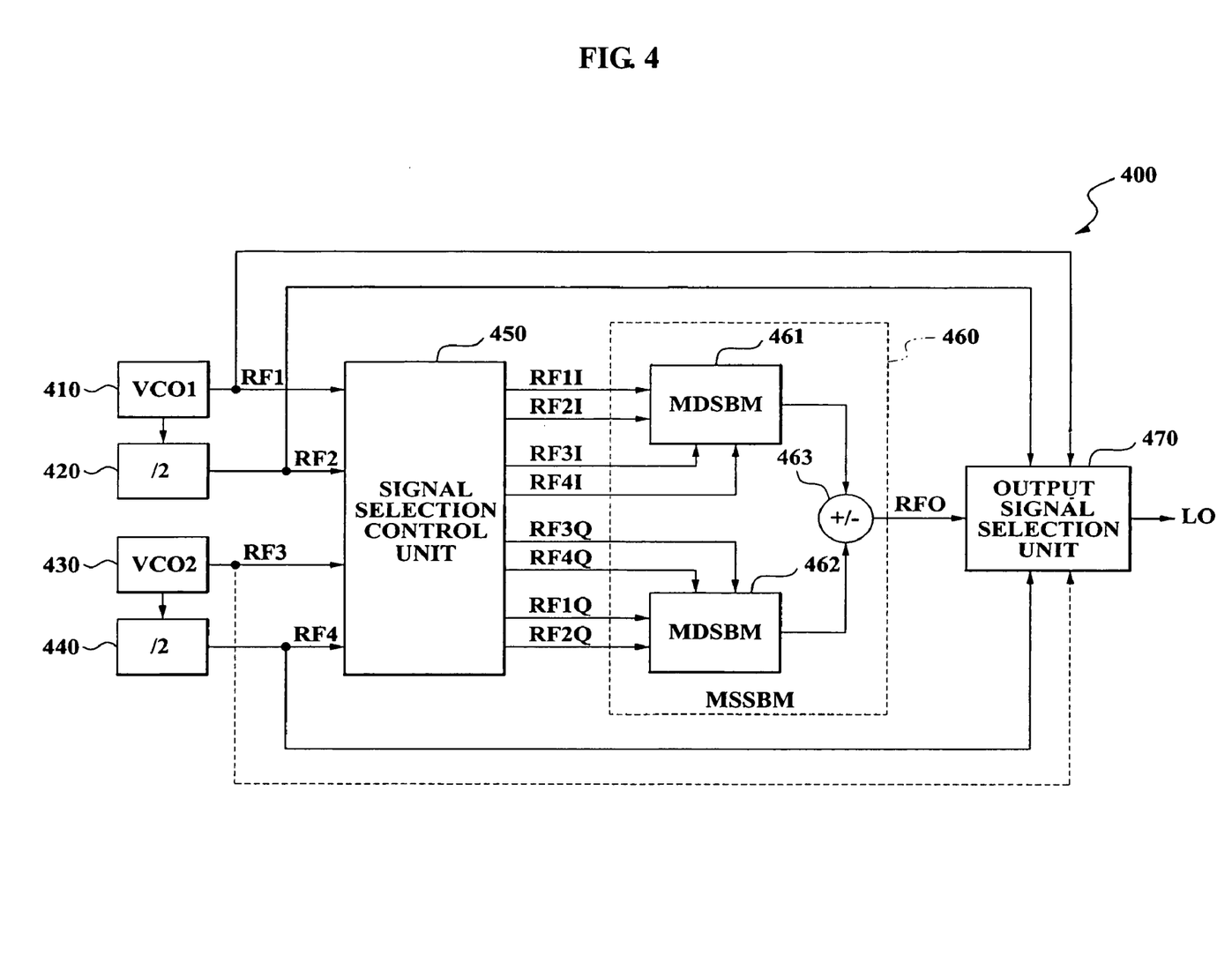
FIG. 4 is a diagram exemplarily illustrating a multi-input multi-frequency mixer shown in FIG. 3.

FIG. 4 illustrates a multi-input multi-frequency mixer (MFM) 400 according to an exemplary embodiment of the present invention for embodying the MFM 350 illustrated in FIG. 3. Referring to FIG. 4, the MFM 400 includes a first VCO 410, a first frequency divider 420, a second VCO 430, a second frequency divider 440, a signal selection control unit 450, a multi-input SSB mixer 460 and an output signal selection unit 470.

The first VCO 410 generates a signal RF1 having a certain frequency, for example, 4488 MHz. That is, the first VCO 410 generates a first high frequency signal RF1I and a Q signal, RF1Q, thereof. According to a signal which is generated in the first VCO 410, the first frequency divider 420 generates a signal RF2 having a half of frequency of the generated signal in the first VCO 410, for example, 2244 MHz. That is, the first frequency divider 420 generates a second high frequency signal RF2I and a Q signal, RF2Q, thereof.

The second VCO 430 generates a signal RF3 having a different frequency, for example, 1056 MHz. That is, the second VCO 430 generates a third high frequency signal RF3I and a Q signal, RF3Q, thereof. According to a signal which is generated in the second VCO 430, the second frequency divider 440 generates a signal RF4 having a half of frequency of the generated signal in the second VCO 430, for example, 528 MHz. That is, the second frequency divider generates a fourth high frequency signal RF4I and a Q signal RF4Q thereof.

Each of the four frequency signals, which are generated in the first VCO 410 and the first frequency divider 420, and the second VCO 430 and the second frequency divider 440, may be constructed of a set of differential signals having a 180 degree phase difference from each other. As an example, RF1I is a set of two signals having a 180 degree phase difference from each other. Also, RF1Q is a set of two signals having a 180 degree phase difference from each other. Also, each of RF2I, RF2Q, RF3I, RF3Q, RF4I and RF4Q is a set of differential signals.

The first VCO 410 and the second VCO 430 may be a part of Phase Locked Loop (PLL) which operates according to a reference clock signal. Also, a predetermined poly phase filter (PPF) may be utilized to generate the Q signal depending on the circumstance. Hereinafter, the present exemplary embodiment will be further described with respect to four high frequency signals using the first VCO 410 and the first frequency divider 420, and the second VCO 430 and the second frequency divider 440. However, this is only an example, and the present exemplary embodiment may be applied when processing a greater number of high frequency signals using a greater number of VCOs or frequency dividers.

The signal selection control unit 450 selects any two of four signals which are generated from the first VCO 410 and the first frequency divider 420, and the second VCO 430 and the second frequency divider 440, and outputs the selected two signals. Also, the signal selection control unit 450 may control biases which are necessary for operation of the multi-input Single Side Band (SSB) mixer 460. Each of the two signals selected from the signal control unit 450 includes in-phase (I) and quadrature (Q) signals. In this instance, I signals are inputted into a first multi-input double side band mixer (MDSBM) 461 and Q signals are inputted into a second MDSBM 462. Also, as described above, in this case, the selected I signal and Q signal are selected as a set of differential signals and processed.

As an example, the signal selection control unit 450 may select any one of the first signal RF1 and the second signal RF2, and any one of the third signal RF3 and the fourth signal RF4, and output the selected two signals and cut off the remaining signals.

The first MDSBM 461 synthesizes I signals of two signals which are selected from the signal selection control unit 450, and generates a corresponding DSB signal. The second MDSBM 462 synthesizes Q signals of two signals which are selected from the signal selection control unit 450, and generates a corresponding DSB signal.

According to an output of the first MDSBM 461 and an output of the second MDSBM 462, the multi-input SSB mixer 460 generates and outputs an SSB signal RFO whose frequency is a synthesis of frequencies of the two signals selected from the signal selection control unit 450. As an example, when the signal selection control unit 450 selects the first signal RF1, for example, 4488 MHz, and the fourth signal RF4, for example, 528 MHz, the multi-input SSB mixer 460 generates a signal whose frequency is an addition of frequencies of RF1 and RF4 or a difference of frequencies therebetween. In other words, the multi-input SSB mixer 460 generates a 5016 or 3960 MHz signal.

As described above, with respect to every case of two signals selected from the signal selection control unit 450, the multi-input SSB mixer 460 may generate and output a corresponding SSB signal RFO whose frequency is an addition of frequencies of two signals or a difference of frequencies therebetween. Whether to select an addition of frequencies of two signals or a subtraction therebetween is determined by the adder/subtractor 463 to add or subtract outputs of the first MDSBM 461 and the second MDSBM 462. Also, a frequency of the multi-input SSB mixer 460 may be determined by controlling a phase of signals outputted to the first MDSBM 461 or the second MDSBM 462 via the signal selection control unit 450, not the adder/subtractor 463. In this instance, the adder/subtractor 463 may be embodied by connection between an output of the first MDSBM 461 and an output of the second MDSBM 462 in an actual circuit. As an example, an addition of frequencies of two signals or a subtraction therebetween may be selected by connecting differential signals that are outputted from the first MDSBM 461 and differential signals that are outputted from the second MDSBM 462 differently. In this aspect, the adder/subtractor 463 corresponds to an SSB signal selection unit.

Also, signal selection control unit 450 may enable an output frequency of the multi-input SSB mixer 460 to be determined by controlling a phase of a signal that is outputted to the first MDSBM 461 or the second MDSBM 462. As an example, when the signal selection control unit 450 selects the first signal RF1, for example, 4488 MHz, and the fourth signal RF4, for example, 528 MHz, and inputs differential signals of RF4I constituting the fourth signal RF4 into the first MDSBM 461, the multi-input SSB mixer 460 may generate a signal whose frequency is an addition of frequencies of two signals or a difference of frequencies therebetween, by exchanging the differential signals of RF4I which is input into the first MDSBM 461 and inputting the exchanged differential signals. Also, when the differential signals of RF4I are left as they are, and the differential signals of RF4Q of the fourth signal RF4 are exchanged and the exchanged differential signals are input into the multi-input SSB mixer 460, the multi-input SSB mixer 460 may generate a signal whose frequency is an addition of frequencies of two signals or a difference of frequencies therebetween. Also, even when differential signals of RF1I or differential signals of RF1Q constituting the first signal RF1 are exchanged and thereby inputted, the multi-input SSB mixer 460 may generate a signal whose frequency is an addition of frequencies of two signals or a difference of frequencies therebetween.

As described above, with respect to two signals selected from the signal selection control unit 450, the multi-input SSB mixer 460 may generate the frequency synthesized signal RFO having any one of eight center frequencies, such as 5544, 5016, 3960, 3432, 3300, 2772, 1716, and 1188 MHz in the above-described example.

Accordingly, the output signal selection unit 470 selects and outputs any one of five signals generated from the first VCO 410 and the first frequency divider 420, and the second VCO 430 and the second frequency divider 440, and a signal outputted from the multi-input SSB mixer 460. The output signal selection unit 470 may output a signal having any one of twelve frequencies. Accordingly, the MFM 400 may cover all communication bands, such as a band between 800 and 900 MHz used by a CDMA system and a GSM system; a band between 1700 and 2200 MHz used by a PCS, data communication system (DCS); 1800 MHz used by Universal Mobile Telecommunications System (UMTS) and WCDMA system; a band between 2300 and 2500 MHz used by Wibro, WLAN, ZigBee and Bluetooth systems; a band between 3500 and 3600 MHz used by WiMax system; a band between 3100 and 4800 MHz used by a UWB-Mode 1 system; and a band between 5200 and 5800 MHz used by WLAN system.

As a circuit of the multi-input SSB mixer 460 is constructed to receive additional high frequency signals, it is possible to increase a number of cases selecting two signals in the signal selection control unit 450. Accordingly, the MFM 400 may selectively generate a large number of high frequency signals having various frequencies by using one multi-input SSB mixer 460.

Figure 5:
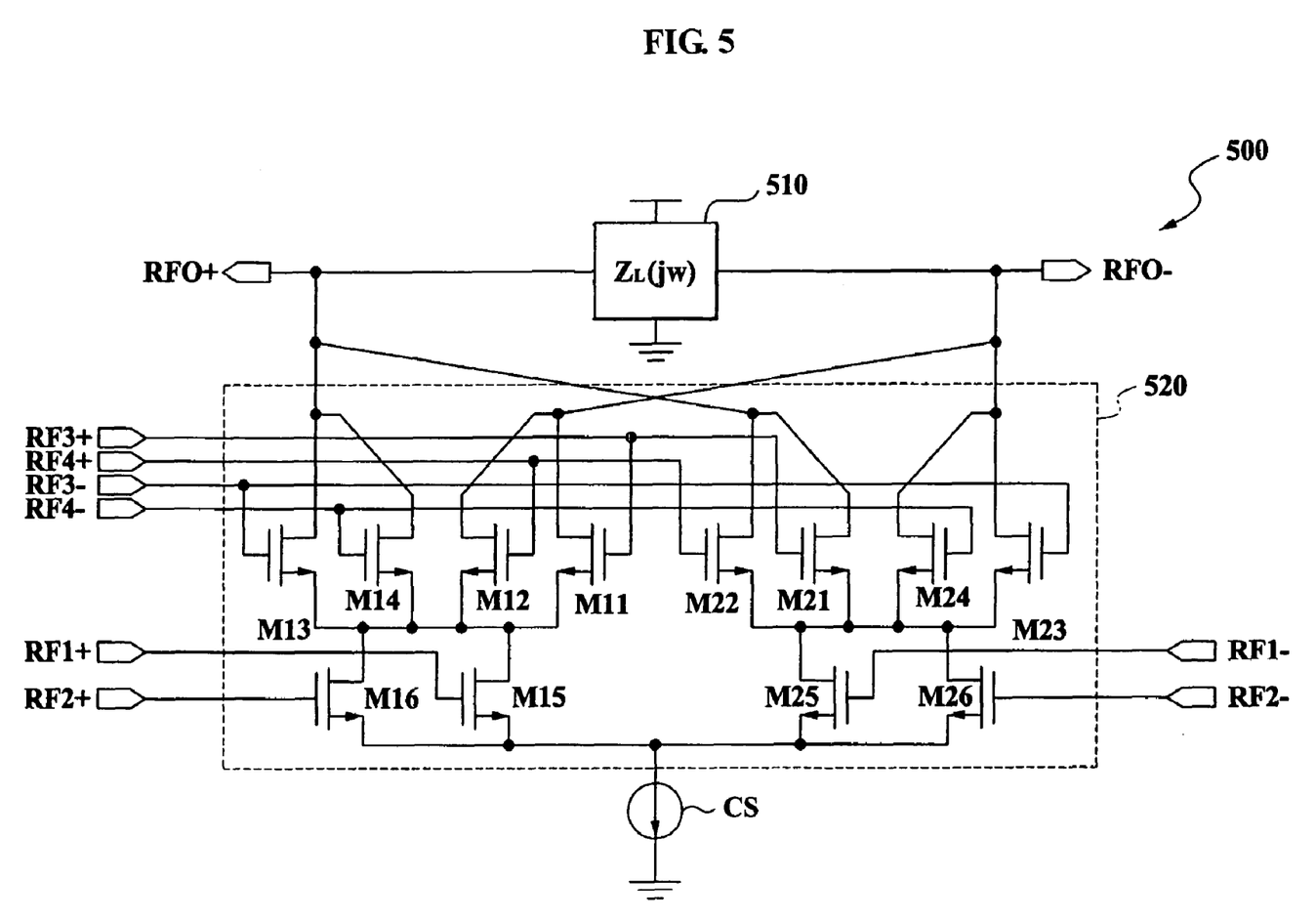
FIG. 5 is an explicit circuit diagram exemplarily illustrating a multi-input multi-frequency DSB mixer shown in FIG. 4.

A circuit 500 illustrated in FIG. 5 may be utilized as a circuit for each of the first MDSBM 461 and the second MDSBM 462 which constitute the multi-input SSB mixer 460. Namely, the multi-input SSB mixer 460 may be embodied by providing two circuits of 500 and appropriately connecting output terminals RFO+ and RFO−. In this instance, a load circuit 510 of the circuit 500 may be commonly utilized in the first MDSBM 461 and the second MDSBM 462. Received high frequency signals RF1 to RF4 must be RF1I to RF4I shown in FIG. 4, so that the circuit 500 may be implemented as the first MDSBM 461. Also, received high frequency signals RF1 to RF4 must be RF1Q to RF4Q shown in FIG. 4, so that the circuit 500 may be implemented as the second MDSBM 462. High frequency signals are inputted into the circuit 500, as a set of differential signals, that is, RF1+ to RF4+ and RF1− to RF4−. As an example, RF1+ and RF1− are signals having a 180 degree phase difference from each other. Also, each pair of RF2+ and RF2−, RF3+ and RF3−, and RF4+ and RF4− are signals having a 180 degree phase difference from each other.

The circuit 500 is in a form of a differential amplifier and includes a differential input circuit 520 between a load circuit 510 and a current source CS. In this instance, the load circuit 510 includes an inductor, a capacitor or a resistor, and is also designed to have an impedance $Z_L$. The differential input circuit 520 includes transistors connected with each other for receiving multi-input high frequency signals RF1 to RF4. Namely, N-metal-oxide semiconductor field effect transistors (MOSFETs) M15 and M16 which are connected in parallel to receive the first high frequency signal RF1+ and the second high frequency signal RF2+, and N-MOSFETs M25 and M26 which are connected in parallel to receive differential signals, RF1− and RF2−, of the first and second high frequency signals RF1+ and RF2+ are symmetrically provided. Also, N-MOSFETs M11, M12, M13 and M14 and other symmetrical N-MOSFETs M21, M22, M23 and M24 for receiving the third high frequency signal RF3+ and the fourth high frequency signal RF4+, and differential signals thereof, RF3− and RF4− are provided.

In this instance, the circuit 500 including transistors M11 to M16 and M21 to M26 receiving four signals, such as RF1 to RF4, has been described as an example, but it is to be noted that the present invention is not limited thereto. The circuit 500 may be constructed to include more transistors as deemed necessary, and thereby receive and synthesize a greater number of high frequency signals.

The circuit 500 may generate a DSB signal by synthesizing I/Q signals of any two signals, for example, RF1 and RF4, selected from the signal selection control unit 450 shown in FIG. 4. When the multi-input SSB mixer 460 is implemented such that the circuit 500 is utilized in the first MDSBM 461 and the second MDSBM 462 shown in FIG. 4 by appropriately connecting each output such as RFO+ and RFO−, the multi-input SSB mixer 460 generates an SSB signal whose frequency is an addition of frequencies of two signals or a difference of frequencies therebetween according to a DBS signals from the first MDSBM 461 and the second MDSBM 462. As described above, in an SSB mixer embodied by connecting two DSB mixers (each of the DSB mixers, as shown in FIG. 5), the SSB mixer may add or subtract frequencies of two signals by making an RF1+ terminal receive RF1− and making an RF1− terminal receive RF1+ with respect to any one between the two DSB mixers.

Figure 6:
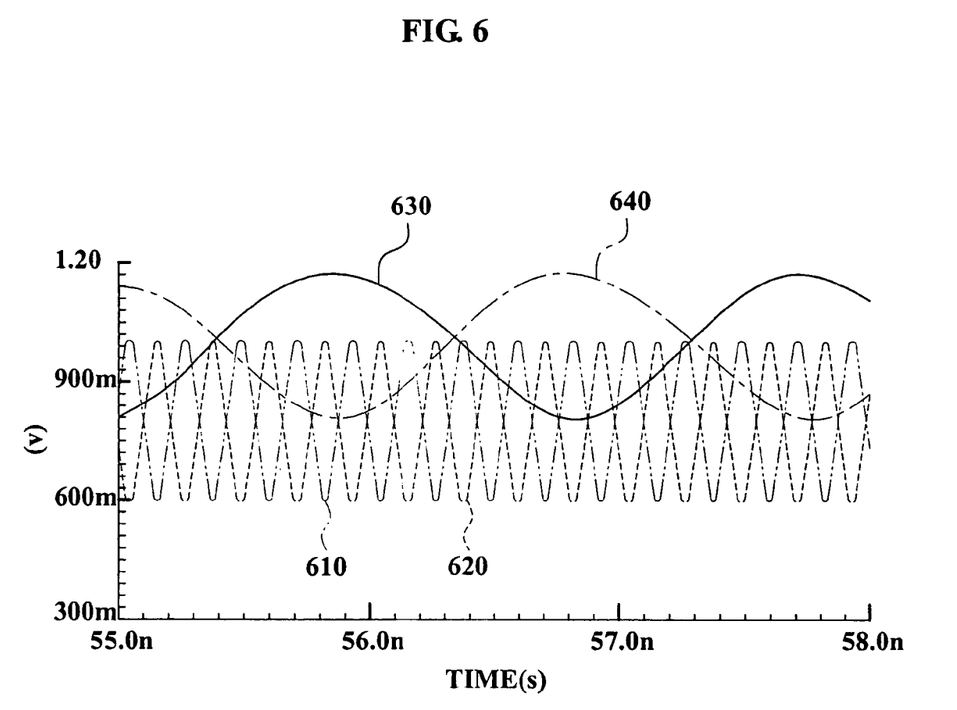
FIG. 6 is a waveform diagram illustrating an example of two input signals according to an exemplary embodiment of the present invention.
Figure 7:
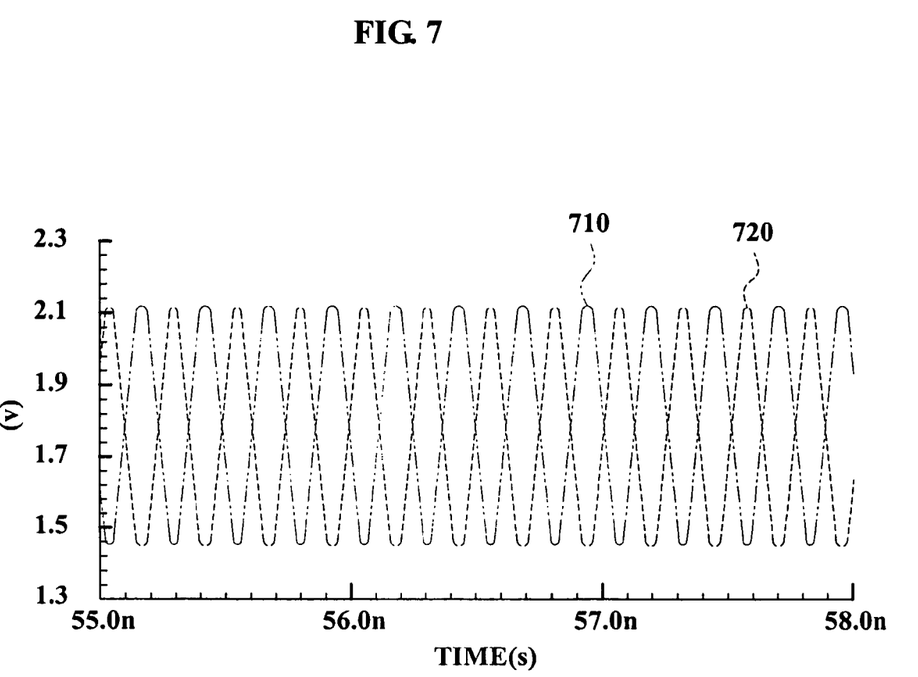
FIG. 7 is a waveform diagram illustrating an example of output signals with respect to input signals of FIG. 6.

As an example, when the signal selection control unit 450 selects a set of differential signals 610 and 620 in 4488 MHz and a set of differential signals 630 and 640 in 528 MHz, as shown in FIG. 6, the multi-input SSB mixer 460 including the circuit shown in FIG. 5 may generate a signal whose frequency is a difference of frequencies between 4488 MHz and 528 MHz. That is, the multi-input SSB mixer 460 may generate a set of differential signals 710 and 720 of 3960 MHz as illustrated in FIG. 7. In this instance, as described above, a signal of 5016 MHz, which is an addition of frequencies of two signals, may be generated by controlling a phase of differential signals inputted into the multi-input SSB mixer 460 via the signal selection control unit 450. The signal of 3960 MHz may be utilized as a local signal for down converting an RF signal of an UWB method to a baseband. Also, the signal of 5016 MHz may be utilized as a local signal for down converting an RF signal of a WLAN method to a baseband.

As described above, the MFM 400 according to an exemplary embodiment of the present invention may generate a large number of high frequency signals by using one multi-input SSB mixer 460. The multi input SSB mixer 460 may generate a signal whose frequency is an addition of frequencies of two signals or a difference of frequencies therebetween. In this instance, the two signals are selected from the signal selection control unit 450. According to a circuit configuration of the multi-input SSB mixer 460, cases where the signal selection control unit 450 selects two signals may be increased.

As described above, a frequency synthesizer according to the present invention receives multi-inputs, and thereby generates and outputs multi-frequency signals. That is, the frequency synthesizer may supply multi-frequency local signals, which are necessary for a multi-band RF receiver, by using a small circuit area and also operate at a high speed with a low power consumption. Accordingly, the frequency synthesizer may be applied to a transceiver of a ubiquitous system or a cellular phone, a DMB phone and a PDA, and improve system performance.

The invention can also be embodied in computer readable codes on a computer readable recording medium. The computer readable recording medium is any data storage device that can store data which can be thereafter be read by a computer system. Examples of the computer readable recording medium include read-only memory (ROM), random-access memory (RAM), CD-ROMs, magnetic tapes, floppy disks, optical data storage devices, and carrier waves, such as data transmission through the Internet. The computer readable recording medium can also be distributed over network coupled computer systems so that the computer readable code is stored and executed in a distributed fashion.

Although a few exemplary embodiments of the present invention have been shown and described, the present invention is not limited to the described exemplary embodiments. Instead, it would be appreciated by those ordinarily skilled in the art that changes may be made to these exemplary embodiments without departing from the principles and spirit of the invention, the scope of which is defined by the claims and their equivalents.

What is claimed is:

1. A frequency synthesizer comprising:
a first multi-input double side band (DSB) mixer which synthesizes a first input signal and a second input signal, which are selected from a plurality of high frequency signals, and generates a first synthesized signal;

a second multi-input DSB mixer which synthesizes a Q signal of the first input signal and a Q signal of the second input signal, and generates a second synthesized signal; and a single side band (SSB) signal selection unit which generates a third synthesized signal whose frequency is a synthesis of a frequency of the first input signal and a frequency of the second input signal, from the first synthesized signal and the second synthesized signal.

2. The frequency synthesizer of claim 1, wherein the third synthesized signal is an SSB signal whose frequency is an addition of frequencies of the first input signal and the second input signal or a difference of frequencies between the first input signal and the second input signal.

3. The frequency synthesizer of claim 1, wherein the SSB signal selection unit is an adder/subtractor which adds or subtracts the first synthesized signal and the second synthesized signal.

4. The frequency synthesizer of claim 1, wherein the first multi-input DSB mixer and the second multi-input DSB mixer are implemented with a differential amplifier having transistors which receive the plurality of high frequency signals between a load circuit and a current source.

5. The frequency synthesizer of claim 1, wherein:

the first multi-input DSB mixer comprises:

a first plurality of transistors which receives the first input signal and the second input signal of the plurality of high frequency signals; and a second plurality of transistors which receives signals that are not the first input signal and the second input signal among the plurality of high frequency signal, and the second multi-input DSB mixer comprises:

a third plurality of transistors which receives the Q signal of the first input signal and the Q signal of the second input signal of Q signals of the plurality of high frequency signals; and a fourth plurality of transistors which receives signals that are not the Q signal of the first input signal and the Q signal of the second input signal among the Q signals of the plurality of high frequency signals.

6. The frequency synthesizer of claim 1, wherein each of the first input signal, the second input signal, the Q signal of the first input signal and the Q signal of the second input signal, is a set of differential signals.

7. The frequency synthesizer of claim 1, further comprising:

a signal selection control unit which inversely changes phases of differential signals of any one of the first input signal, the second input signal, the Q signal of the first input signal and the Q signal of the second input signal.

8. A frequency synthesizer comprising:

a signal selection control unit which selects and outputs a first signal and a Q signal of the first signal, and a second signal and a Q signal of the second signal, from a plurality of high frequency signals; and a multi-input single side band (SSB) mixer which generates and outputs a signal, whose frequency is a synthesis of frequencies of the first signal and the second signal, from the first signal, the Q signal of the first signal, the second signal and the Q signal of the second signal, wherein the multi-input SSB mixer comprises DSB mixers containing transistors which receive the plurality of high frequency signals and Q signals of the plurality of high frequency signals, and the multi-input SSB mixer generates and outputs a corresponding frequency synthesized signal when signals selected by the signal selection control unit are changed.

9. The frequency synthesizer of claim 8, further comprising:

at least one voltage controlled oscillator (VCO) which generates a portion of the plurality of high frequency signals and a portion of the Q signals of the plurality of high frequency signals; and at least one frequency divider which generates a remaining number of the plurality of high frequency signals and a remaining number of the Q signals of the plurality of high frequency signals, based on a signal generated from the at least one VCO.

10. The frequency synthesizer of claim 8, further comprising:

an output signal selection unit which selects and outputs any one of the plurality of high frequency signals and the output of the multi-input SSB mixer.

11. The frequency synthesizer of claim 8, wherein an output of the frequency synthesizer and a radio frequency (RF) signal received from an RF receiver are synthesized in a predetermined mixer and the received RF signal is directly down converted to a baseband signal.

12. A frequency synthesizing method comprising:

first synthesizing a first input signal and a second input signal selected from a plurality of high frequency signals, in a first DSB mixer;

second synthesizing a Q signal of the first input signal and a Q signal of the second input signal selected from Q signals of the plurality of high frequency signals, in a second DSB mixer; and third synthesizing the first synthesized signal and the second synthesized signal.

13. The method of claim 12, wherein the third synthesized signal is a signal whose frequency is an addition of frequencies of the first input signal and the second input signal or a difference of frequencies between of the first input signal and the second input signal.

14. The method of claim 12, wherein each of the first input signal, the second input signal, the Q signal of the first input signal and the Q signal of the second input signal is a set of differential.

15. The method of claim 12, further comprising:

inversely changing phases of differential signals of any one of the first input signal, the second input signal, the Q signal of the first input signal and the Q signal of the second input signal.

16. The method of claim 12, wherein the first DSB mixer includes transistors for receiving the plurality of high frequency signals and the second DSB mixer includes transistors for receiving the Q signals of the high frequency signals.

* * * * *